(12) United States Patent
Kitamura et al.

(10) Patent No.: US 10,483,312 B2
(45) Date of Patent: Nov. 19, 2019

(54) BACKSIDE-ILLUMINATED COMPLEMENTARY METAL OXIDE SEMICONDUCTOR SENSOR AND THE MANUFACTURING METHOD THEREOF

(71) Applicant: HUAIAN IMAGING DEVICE MANUFACTURER CORPORATION, Huaian, Jiangsu (CN)

(72) Inventors: Yosuke Kitamura, Huaian (CN); Amane Oishi, Huaian (CN); Xiaolu Huang, Huaian (CN)

(73) Assignee: HUAIAN IMAGING DEVICE MANUFACTURER CORPORATION, Huaian (CN)

( * ) Notice: Subject to any disclaimer, the term of this patent is extended or adjusted under 35 U.S.C. 154(b) by 0 days.

(21) Appl. No.: 16/003,526

(22) Filed: Jun. 8, 2018

(65) Prior Publication Data

US 2019/0140000 A1 May 9, 2019

(30) Foreign Application Priority Data

Nov. 7, 2017 (CN) .......................... 2017 1 1081524

(51) Int. Cl.
*H01L 31/0232* (2014.01)
*H01L 27/146* (2006.01)

(52) U.S. Cl.
CPC ...... *H01L 27/1464* (2013.01); *H01L 27/1463* (2013.01); *H01L 27/14629* (2013.01); *H01L 27/14636* (2013.01); *H01L 27/14645* (2013.01); *H01L 27/14685* (2013.01); *H01L 27/14621* (2013.01); *H01L 27/14627* (2013.01)

(58) Field of Classification Search
USPC ........................................................ 257/432
See application file for complete search history.

(56) References Cited

U.S. PATENT DOCUMENTS

| | | | |
|---|---|---|---|
| 2008/0135963 A1 | 6/2008 | Akiyama | |
| 2010/0148290 A1 | 6/2010 | Park | |
| 2010/0171191 A1 | 7/2010 | Lee | |
| 2012/0199930 A1* | 8/2012 | Hayashi | H01L 27/1461 257/435 |
| 2014/0035086 A1 | 2/2014 | Kato | |

(Continued)

FOREIGN PATENT DOCUMENTS

| | | |
|---|---|---|
| CN | 101197387 A | 6/2008 |
| CN | 103765584 A | 4/2014 |

(Continued)

OTHER PUBLICATIONS

Office Action in Chinese Patent Application No. 201711081524.8, dated Jul. 23, 2019 (10 pages).

*Primary Examiner* — Niki H Nguyen
(74) *Attorney, Agent, or Firm* — Bookoff McAndrews, PLLC

(57) ABSTRACT

A backside-illumination complementary metal oxide semiconductor (CMOS) image sensor, comprises a semiconductor substrate including a first side for receiving incident light and a second side opposite to the first side; and a reflector disposed at the second side of the semiconductor substrate, wherein the reflector is configured to reflect incident light that transmits through the semiconductor substrate back into the semiconductor substrate.

13 Claims, 4 Drawing Sheets

(56) References Cited

U.S. PATENT DOCUMENTS

2014/0054662 A1* 2/2014 Yanagita .......... H01L 27/14643
              257/291
2015/0028405 A1* 1/2015 Minami ........... H01L 27/14629
              257/294
2015/0069564 A1   3/2015 Hatano et al.

FOREIGN PATENT DOCUMENTS

| CN | 103765590 A | 4/2014 |
| CN | 104425536 A | 3/2015 |
| WO | WO2013031707 A1 | 3/2013 |

* cited by examiner

BACKSIDE-ILLUMINATED COMPLEMENTARY METAL OXIDE SEMICONDUCTOR SENSOR AND THE MANUFACTURING METHOD THEREOF

CROSS REFERENCE TO RELATED APPLICATIONS

This application claims priority to Chinese Patent Application No. 201711081524.8, filed on Nov. 7, 2017, which is hereby incorporated by reference in its entirety.

BACKGROUND

With the development of semiconductor technologies, backside-illuminated complementary metal oxide semiconductor (CMOS) image sensors are more and more adopted. Backside-illuminated CMOS image sensors have light incident from backside which enters into the light-sensing element first. This configuration can avoid the affect from circuit wiring layers and transistors of traditional CMOS image sensor configuration, and can greatly increase the efficiency of light, improve the photographing effect in a low illumination condition such that the focusing ability and image quality both improved greatly in the low illumination condition.

SUMMARY

According to a first aspect of the present disclosure, a backside-illumination complementary metal oxide semiconductor (CMOS) image sensor is provided, comprising a semiconductor substrate including a first side for receiving incident light and a second side opposite to the first side; and a reflector disposed at the second side of the semiconductor substrate. The reflector is configured to reflect incident light that transmits through the semiconductor substrate back into the semiconductor substrate.

According to a second aspect of the present disclosure, a method of manufacturing a backside-illumination complementary metal oxide semiconductor (CMOS) image sensor is provided, comprising providing a semiconductor substrate including a first side for receiving incident light and a second side opposite to the first side; and forming a reflector at the side of the semiconductor substrate. The reflector is configured to reflect the incident light that transmits through the semiconductor substrate back into the semiconductor substrate.

Further features of the present disclosure and advantages thereof will become apparent from the following detailed description of exemplary embodiments with reference to the attached drawings.

BRIEF DESCRIPTION OF DRAWINGS

The accompanying drawings, which constitute a part of the specification, illustrate embodiments of the present disclosure and, together with the description, serve to explain the principles of the present disclosure.

Figure 1:
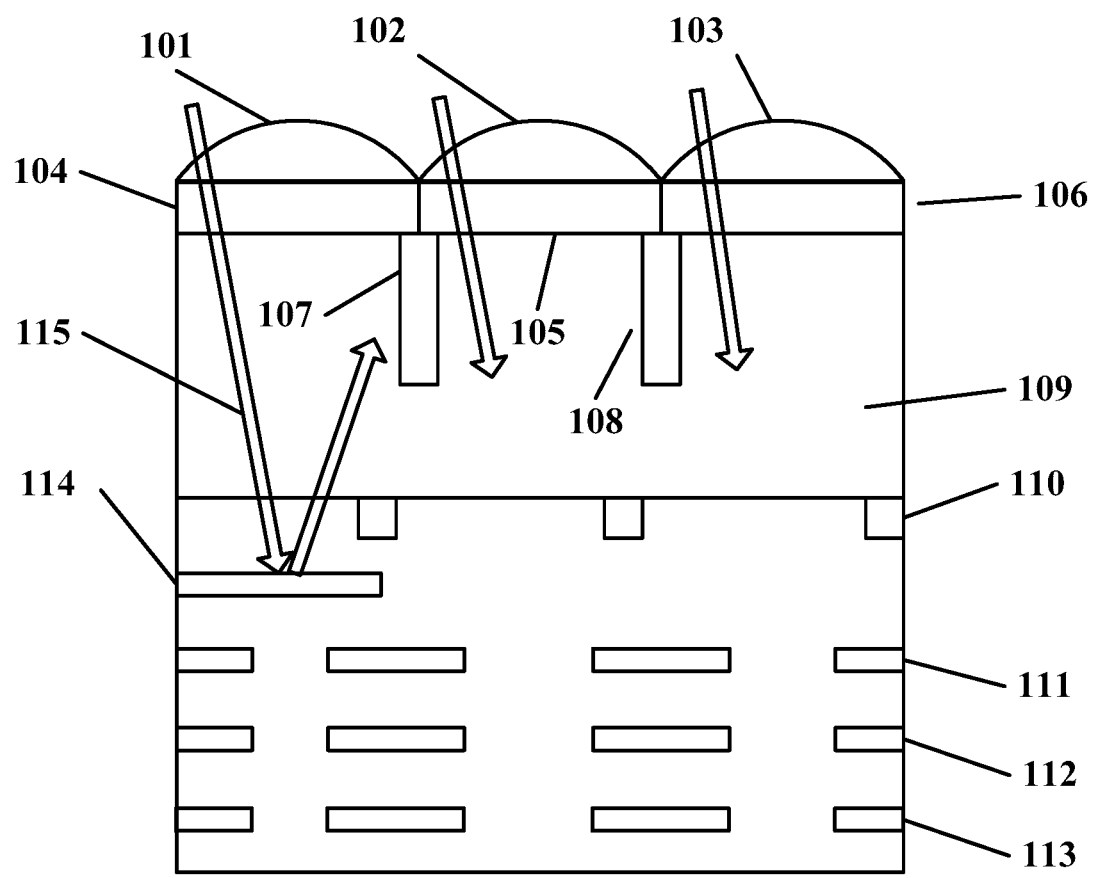
FIG. 1 is a schematic drawing of a backside-illuminated complementary metal oxide semiconductor (CMOS) image sensor according to an embodiment of the present disclosure.

Note that, in the embodiments described below, in some cases the same portions or portions having similar functions are denoted by the same reference numerals in different drawings, and description of such portions is not repeated. In some cases, similar reference numerals and letters are used to refer to similar items, and thus once an item is defined in one figure, it need not be further discussed for following figures.

In order to facilitate understanding, the position, the size, the range, or the like of each structure illustrated in the drawings and the like are not accurately represented in some cases. Thus, the disclosure is not necessarily limited to the position, size, range, or the like as disclosed in the drawings and the like.

DETAILED EMBODIMENTS

Various exemplary embodiments of the present disclosure will be described in details with reference to the accompanying drawings in the following. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit this disclosure, its application, or uses. That is to say, the structure and method discussed herein are illustrated by way of example to explain different embodiments according to the present disclosure. It should be understood by those skilled in the art that, these examples, while indicating the implementations of the present disclosure, are given by way of illustration only, but not in an exhaustive way. In addition, the drawings are not necessarily drawn to scale, and some features may be enlarged to show details of some specific components.

Techniques, methods and apparatus as known by one of ordinary skill in the relevant art may not be discussed in detail, but are intended to be regarded as a part of the specification where appropriate.

In all of the examples as illustrated and discussed herein, any specific values should be interpreted to be illustrative only and non-limiting. Thus, other examples of the exemplary embodiments could have different values.

With the development of the semiconductor technologies, a silicon substrate for a backside-illuminated (BSI) complementary metal oxide semiconductor (CMOS) image sensor is becoming thinner and thinner. However, the inventors of the present disclosure notice that a conversion efficiency of incident light decreases. For example, for a red light, more than 30% of incident light is not converted to electrons when a thickness of the silicon substrate is about 2.5 µm.

To solve problems exist in prior backside-illuminated CMOS image sensors, some embodiment of the present disclosure provide a new type of backside-illuminated CMOS image sensor and a manufacturing method thereof.

FIG. 1 is a schematic drawing of a backside-illuminated CMOS image sensor according to an embodiment of the present disclosure. As shown in FIG. 1, the backside-illuminated CMOS image sensor includes a semiconductor substrate 109. Photosensitive elements (such as photodiodes) for sensing incident light are formed in the semiconductor substrate 109. The semiconductor 109 has a first side and a second side opposite to the first side. Optical filters are disposed at the first side, such a red filter 104, a green filter 105 and a blue filter 106. The optical filters 104-106 may filter incident light and allow only light of corresponding color to incident on the photosensitive elements (such as photodiodes) below the optical filters.

Lenses 101, 102 and 103 are disposed on the optical filters of the three colors. Lens 101 is disposed on the red filter 104, lens 102 is disposed on the green filter 105, and lens 103 is disposed on the blue filter 106. Thus, each lens, optical filter and the corresponding semiconductor substrate below together consist of a pixel of corresponding color. Pixel isolations 107 and 108 are also disposed in the semiconductor substrate 109. The pixel isolation 107 is positioned between the red pixel and the green pixel, and the pixel isolation 108 is positioned between the green pixel and the blue pixel. The purpose of the pixel isolations 107 and 108 is to prevent incident light of different colors from entering into neighbor pixels, so that the cross talk between neighbor pixels may be avoided.

The image sensor according to an embodiment of the present disclosure also includes gate electrodes 110 and one or more wiring layers on the second side of the semiconductor substrate 109. As shown in FIG. 1, three wiring layers are shown, i.e. first wiring layer (first metal layer M1) 111, second wiring layer 112 and third wiring layer 113.

Further, a reflector 114 is disposed at the second side of the semiconductor substrate 109. As shown in FIG. 1, the reflector 114 is disposed at a position corresponding to the red filter 104. The reflector 114 can reflect remaining red light (incident light that have been filtered by the red filter 104 and transmitted through the semiconductor substrate 109) back into the semiconductor 109. Thus, the reflected red light may be absorbed and converted by the semiconductor 109 again. The conversion efficiency of the red light in the incident light is improved.

Among the red, green and blue lights of the incident light, it is most easy for the red light to transmit through the semiconductor substrate 109. The reflector 104 disposed at the position corresponding to the red pixel can significantly increase the conversion efficiency of red light.

FIG. 1 shows a reflector 114 disposed at the position corresponding to the red filter 104, and only red light which transmits through the semiconductor 109 is reflected. However, a skilled person in the art should understand that it is also possible for green and/or blue light to transmit through the semiconductor substrate 109 when the semiconductor substrate 109 becomes thinner. Therefore, more reflectors 114 may be disposed to improve the conversion efficiency of the green and/or blue light. For example, reflectors 114 may also be disposed at positions corresponding to the green filter 105 and/or the blue filter 106, such that green and/or blue light transmitted through the semiconductor substrate 109 may also be reflected. In this way, the absorption and conversion efficiency of all colors of the incident light may be increased. In an embodiment of the present disclosure, reflectors 114 are disposed at positioned corresponding to the red filter 104 and green filter 105. In another embodiment of the present disclosure, reflectors 114 are disposed at positioned corresponding to the red filter 104, green filter 105 and the blue filter 106.

In an embodiment of the present disclosure, the reflector 114 is made of an electrically conductive material such as a metal material. For example, the metal material may be selected from a group of Cu, W, Al, Ag and Au.

In another embodiment of the present disclosure, the reflector 114 may be electrically grounded. When the reflector 114 is made of an electrically conductive material, photodiodes in the semiconductor substrate 109 may be affected, and operation of the photodiodes may not be stable. An ungrounded reflector 114 may become a source of noise because the photodiodes are operated by capacitive coupling. Therefore, grounding the reflector 114 may reduce noise in the photodiodes.

Figure 2:
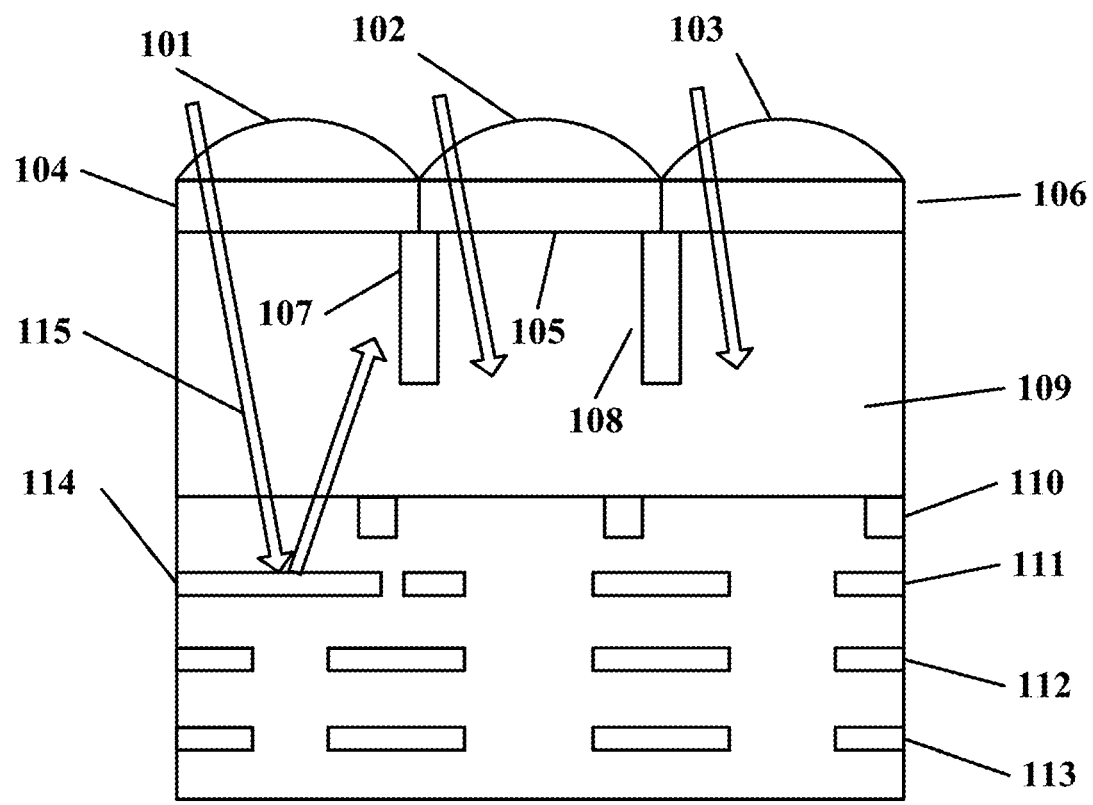
FIG. 2 a schematic drawing of a backside-illuminated complementary metal oxide semiconductor (CMOS) image sensor according to an embodiment of the present disclosure.

FIG. 2 shows a schematic drawing of a backside-illuminated complementary metal oxide semiconductor (CMOS) image sensor according to an embodiment of the present disclosure. The backside-illuminated CMOS image sensor as shown in FIG. 2 differs from that of FIG. 1 in that the reflector 114 is disposed a wiring layer 111 which is closest to the semiconductor substrate 109 among the wiring layers 111-113. As will be described later, by disposing the reflector 114 in the wiring layer, the reflector 114 may be formed in the step of forming the wiring layer. Thus the steps of manufacturing the backside-illumination CMOS image sensor may be reduced, and cost for production may be lowered.

Further, as shown in FIG. 2, the reflector 114 is disposed in the wiring layer 111 which is closest to the semiconductor substrate 109. In this way, light transmitted through the semiconductor substrate 109 can be directly reflected, by the reflector 114, back into the semiconductor substrate 109 without passing through other wiring layers. Thus, the loss of light may be reduced. Since a distance between the reflector 114 and the semiconductor substrate 109 is small, it is also helpful to reduce the light reflected to neighbor pixels. The cross talk among pixels may be avoided. Of course, a skilled person in the art should understand that the present disclosure is not limited. The reflector 114 may be disposed in other wiring layers according to specific needs of design.

Also, the wiring layers on the second side of the semiconductor substrate 109 are not limited to three layers, and may be 1, 2, 4 or more layers.

Figure 3:
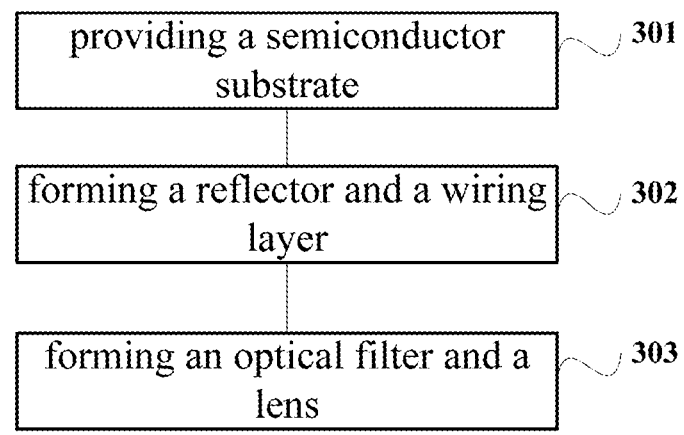
FIG. 3 shows a flow chart of a method of manufacturing a backside-illuminated CMOS image sensor according to an embodiment of the present disclosure.
Figure 4A:
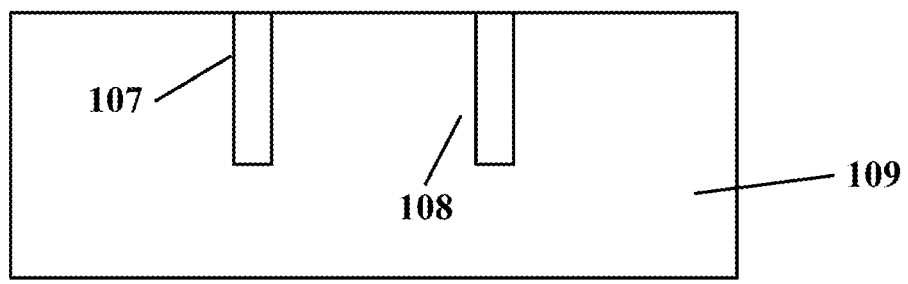
FIG. 4a-FIG. 4c are schematic drawings of a backside-illuminated complementary metal oxide semiconductor (CMOS) image sensor manufactured according to the method shown in FIG. 3.
Figure 4B:
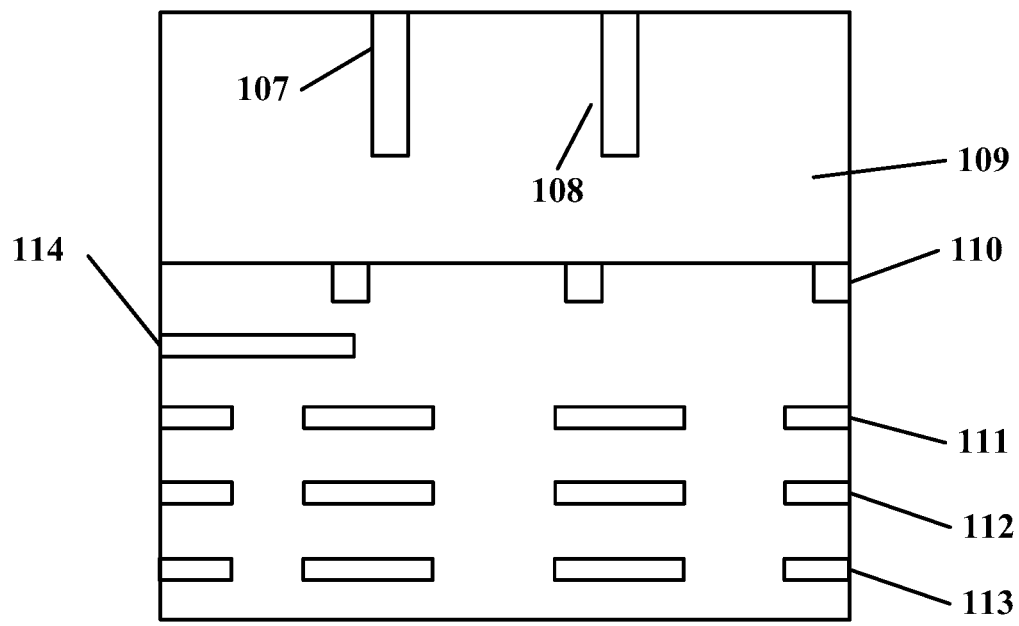
Figure 4C:
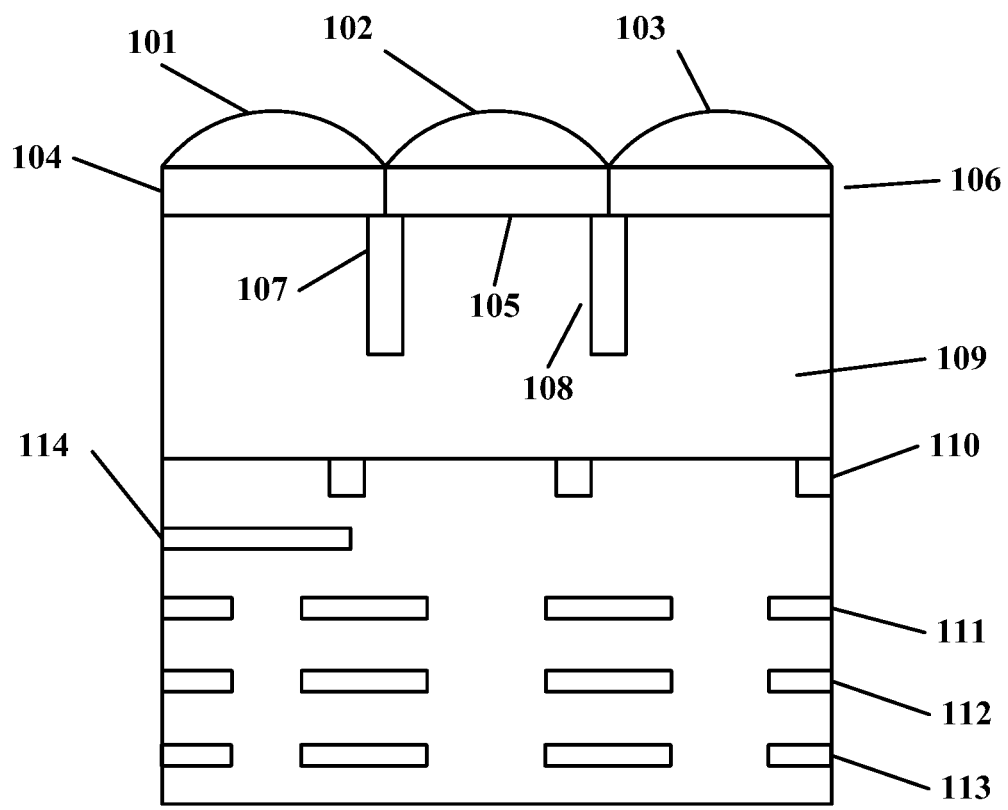

FIG. 3 shows a flow chart of a method of manufacturing a backside-illuminated CMOS image sensor according to an embodiment of the present disclosure. FIG. 4a-FIG. 4c are schematic drawings of a backside-illuminated complementary metal oxide semiconductor (CMOS) image sensor manufactured according to the method shown in FIG. 3.

Firstly, a semiconductor substrate is provided. The semiconductor substrate includes a first side for receiving incident light and a second side opposite to the first side (step 301). Components such as photodiodes and pixel isolations may be formed on the semiconductor substrate. As shown in FIG. 4a, photodiodes (not shown) and pixel isolations 107, 108 are formed in the semiconductor substrate 109.

Then, a reflector and a wiring layer are formed on one side (i.e. the second side) of the semiconductor substrate 109 (step 302). As shown in FIG. 4b, the reflector 104 and wiring layers 111-113 may be formed by chemical vapor deposition, physical vapor deposition or electroplating, etc. As described above, the reflector 114 may be made of electrically conductive materials such as metal (for example at least one of Au, W, Al, Ag, Au, etc.). In an embodiment of the present disclosure, the reflector is formed first, and then the wiring layer(s) is formed. The reflector may be formed in a separate layer (as shown in FIG. 4b), or may be formed in the same layer as one of the wiring layers (as show in FIG. 2). In an alternative embodiment of the present disclosure, the reflector and one of the wiring layers are in the same layer, and the reflector (such as a metal layer capable of reflecting light) may be formed at the same time of preparing the wiring layer. Thus, the wirings in the wiring layer and the reflector may use the same metal material and formed in the same step. The steps of preparation may be reduced, and the cost of production may be saved.

Further, the reflector may be disposed in a position corresponding to the red filter, and reflects only red light (incident light which has been filtered by the red filter) that transmitted through the semiconductor substrate 109. The red light is reflected back into the semiconductor substrate 109 and may be absorbed and converted again by the sensing element (such as photodiodes) in the semiconductor substrate 109.

Further, as described above, the reflectors may also be disposed at positions corresponding to the green filter and/or blue filter. Thus, the green light and/or blue light which transmit through the semiconductor substrate 109 may also be reflected back into the semiconductor substrate 109. The absorption and conversion efficiency of the green light and/or blue light may be increased.

Finally, optical filters and lenses are formed on the other side (the first side opposite to the second side) of the semiconductor substrate 109. As shown in FIG. 4c, optical filters (such as red filter 104, green filter 105 and blue filter 106) and lenses (such as lenses 101-103) are formed on the first side of the semiconductor substrate 109.

The present disclosure does not describe the structure of the sensing elements (such as photodiodes) in the semiconductor substrate or the manufacturing method thereof, and does not describe in detail how to form the wiring layers, optical filters and lenses, etc. However, these contents are familiar for a skilled person in the art. The present disclosure will not repeat these contents.

The terms "front," "back," "top," "bottom," "over," "under" and the like, as used herein, if any, are used for descriptive purposes and not necessarily for describing permanent relative positions. It should be understood that such terms are interchangeable under appropriate circumstances such that the embodiments of the disclosure described herein are, for example, capable of operation in other orientations than those illustrated or otherwise described herein.

The term "exemplary", as used herein, means "serving as an example, instance, or illustration", rather than as a "model" that would be exactly duplicated. Any implementation described herein as exemplary is not necessarily to be construed as preferred or advantageous over other implementations. Furthermore, there is no intention to be bound by any expressed or implied theory presented in the preceding technical field, background, summary or detailed description.

The term "substantially", as used herein, is intended to encompass any slight variations due to design or manufacturing imperfections, device or component tolerances, environmental effects and/or other factors. The term "substantially" also allows for variation from a perfect or ideal case due to parasitic effects, noise, and other practical considerations that may be present in an actual implementation.

In addition, the foregoing description may refer to elements or nodes or features being "connected" or "coupled" together. As used herein, unless expressly stated otherwise, "connected" means that one element/node/feature is electrically, mechanically, logically or otherwise directly joined to (or directly communicates with) another element/node/feature. Likewise, unless expressly stated otherwise, "coupled" means that one element/node/feature may be mechanically, electrically, logically or otherwise joined to another element/node/feature in either a direct or indirect manner to permit interaction even though the two features may not be directly connected. That is, "coupled" is intended to encompass both direct and indirect joining of elements or other features, including connection with one or more intervening elements.

In addition, certain terminology, such as the terms "first", "second" and the like, may also be used in the following description for the purpose of reference only, and thus are not intended to be limiting. For example, the terms "first", "second" and other such numerical terms referring to structures or elements do not imply a sequence or order unless clearly indicated by the context.

Further, it should be noted that, the terms "comprise", "include", "have" and any other variants, as used herein, specify the presence of stated features, integers, steps, operations, elements, and/or components, but do not preclude the presence or addition of one or more other features, integers, steps, operations, elements, components, and/or groups thereof.

In this disclosure, the term "provide" is intended in a broad sense to encompass all ways of obtaining an object, thus the expression "providing an object" includes but is not limited to "purchasing", "preparing/manufacturing", "disposing/arranging", "installing/assembling", and/or "ordering" the object, or the like.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. However, other modifications, variations and alternatives are also possible. The description and drawings are, accordingly, to be regarded in an illustrative rather than in a restrictive sense.

Although some specific embodiments of the present disclosure have been described in detail with examples, it should be understood by a person skilled in the art that the above examples are only intended to be illustrative but not to limit the scope of the present disclosure. The embodiments disclosed herein can be combined arbitrarily with each other, without departing from the scope and spirit of the present disclosure. It should be understood by a person skilled in the art that the above embodiments can be modified without departing from the scope and spirit of the present disclosure. The scope of the present disclosure is defined by the attached claims.

What is claimed is:

1. A backside-illumination complementary metal oxide semiconductor (CMOS) image sensor, comprising
   a semiconductor substrate including a first side for receiving incident light and a second side opposite to the first side; and
   a reflector disposed at the second side of the semiconductor substrate,
   wherein the reflector is configured to reflect incident light that transmits through the semiconductor substrate back into the semiconductor substrate, and
   wherein the reflector is made of an electrically conductive material and is electrically grounded.

2. The backside-illumination CMOS image sensor of claim 1, wherein the electrically conductive material is a metal.

3. The backside-illumination CMOS image sensor of claim 2, wherein the metal includes at least one of Cu, W, Al, Ag and Au.

4. The backside-illumination CMOS image sensor of claim 1, further comprising
a plurality of wiring layers disposed at the second side of the semiconductor substrate,
wherein the reflector is disposed in one of the wiring layers that is closest to the semiconductor substrate.

5. The backside-illumination CMOS image sensor of claim 1, further comprising
a red filter disposed at the first side of the semiconductor substrate,
wherein the reflector is configured to only reflect the incident light that transmits through the red filter.

6. The backside-illumination CMOS image sensor of claim 1, further comprising
a red filter and a green filter both disposed at the first side of the semiconductor substrate,
wherein the reflector is configured to only reflect incident light that transmit through the red filter and the green filter.

7. A method of manufacturing a backside-illumination complementary metal oxide semiconductor (CMOS) image sensor, comprising
providing a semiconductor substrate including a first side for receiving incident light and a second side opposite to the first side; and
forming a reflector at the second side of the semiconductor substrate,
wherein the reflector is configured to reflect the incident light that transmits through the semiconductor substrate back into the semiconductor substrate, and
the reflector is formed with an electrically conductive material and is electrically grounded.

8. The method of claim 7, wherein the electrically conductive material is a metal.

9. The method of claim 8, wherein the metal includes at least one of Cu, W, Al, Ag and Au.

10. The method of claim 7, further comprising
forming a plurality of wiring layers on the second side of the semiconductor substrate,
wherein the reflector is formed in one of the wiring layers that is closest to the semiconductor substrate.

11. The method of claim 10, wherein the reflector and the wiring layer that is closest to the semiconductor substrate are formed simultaneously.

12. The method of claim 7, further comprising
forming a red filter at the first side of the semiconductor substrate,
wherein the reflector is configured to only reflect the incident light that transmit through the red filter.

13. The method of claim 7, further comprising
forming a red filter and a green filter at the first side of the semiconductor substrate,
wherein the reflector is configured to only reflect the incident light that transmit through the red filter and the green filter.

* * * * *